United States Patent [19]

Einzinger et al.

[11] Patent Number: 4,947,234

[45] Date of Patent: Aug. 7, 1990

[54] SEMICONDUCTOR COMPONENT WITH POWER MOSFET AND CONTROL CIRCUIT

[75] Inventors: Josef Einzinger, Unterschleissheim; Ludwig Leipold, Munich; Jeno Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 99,577

[22] Filed: Sep. 22, 1987

[30] Foreign Application Priority Data

Sep. 23, 1986 [DE] Fed. Rep. of Germany ....... 3632199

[51] Int. Cl.$^5$ .............................................. H01L 23/48
[52] U.S. Cl. ........................................ 357/68; 357/74; 357/81; 357/75
[58] Field of Search .................... 357/28, 75, 74, 80, 357/81, 23.4

[56] References Cited

U.S. PATENT DOCUMENTS

| | | | |
|---|---|---|---|
| 4,314,270 | 1/1982 | Iwatani | 357/75 |
| 4,599,576 | 7/1986 | Yoshida | 357/23.8 |
| 4,667,265 | 5/1987 | Stanojevic et al. | 361/103 |
| 4,730,228 | 3/1988 | Einzinger | 357/28 |

FOREIGN PATENT DOCUMENTS

| | | |
|---|---|---|
| 0067752 | 12/1982 | European Pat. Off. . |
| 0075945 | 4/1983 | European Pat. Off. ............. 357/76 |
| 0078194 | 5/1983 | European Pat. Off. . |
| 0240807 | 10/1987 | Fed. Rep. of Germany . |
| 202658 | 3/1985 | Japan . |
| 60-70752 | 4/1985 | Japan . |

OTHER PUBLICATIONS

European Standard Search Report; Apr. 22, 1987.

*Primary Examiner*—Andrew J. James
*Assistant Examiner*—Mark Prenty
*Attorney, Agent, or Firm*—James G. Morrow; Jeffrey P. Morris

[57] ABSTRACT

A semiconductor component with a power MOSFET and control circuit for controlling the power MOSFET. Both the power MOSFET and the control circuit have separate semiconductor bodies. The semiconductor body of the control circuit is arranged on one of the main surfaces of the semiconductor body of the power MOSFET. The control circuit is electrically insulated from the MOSFET by an insulating layer and mechanically coupled to the MOSFET by means of a bonding layer. The MOSFET is fastened to a cooling body which serves as a heat sink for the semiconductor component. The terminals of the control circuit and the MOSFET are attached to housing connections with leads.

21 Claims, 2 Drawing Sheets

SEMICONDUCTOR COMPONENT WITH POWER MOSFET AND CONTROL CIRCUIT

BACKGROUND OF THE INVENTION

The invention relates to a semiconductor component having a power MOSFET and an integrated control circuit for controlling the MOSFET and more specifically to a semiconductor component having a power MOSFET and an integrated control circuit each with a separate semiconductor body. Semiconductors components having a control circuit and a power MOSFET integrated in the same semiconductor body have been brought on the market under various names such as "Smart-FET." This type of configuration presents the drawback that the power MOSFET must be made with the same complex technology as the control circuit. Moreover, given an equal surface area, a markedly higher resistance $R_{DSon}$ results in comparison with conventionally manufactured power MOSFETs. Integration of the power MOSFET and control circuit within the same semiconductor body also requires a larger mounting surface, since adequate cooling is needed for the power circuit.

SUMMARY OF THE INVENTION

It is, therefore, an object of the present invention to simplify the technique for the manufacture of a semiconductor component including a power MOSFET and an integrated control circuit and to reduce the required mounting space for this component.

This and additional objects are attained by the present invention, wherein the preferred embodiment of the semiconductor component includes a power MOSFET having a separate semiconductor body; an integrated control circuit for controlling the MOSFET, the integrated control circuit being integrated in a separate semiconductor body; and an insulating layer for mechanically coupling the semiconductor body of the control circuit with the semiconductor body of the MOSFET, wherein the semiconductor body of the control circuit is arranged on one surface of the semiconductor body of the MOSFET.

Various other objects and advantages of the present invention will become apparent from the following description, with reference to the accompanying drawings.

DETAILED DESCRIPTION OF THE PREFERRED EMBODIMENT

Figure 1:
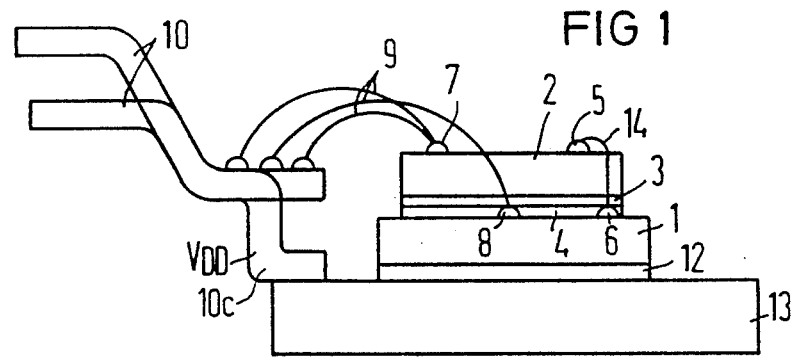
FIG. 1 is a side view of a first embodiment of a semiconductor component with a power MOSFET and control circuit embodying the present invention.
Figure 2:
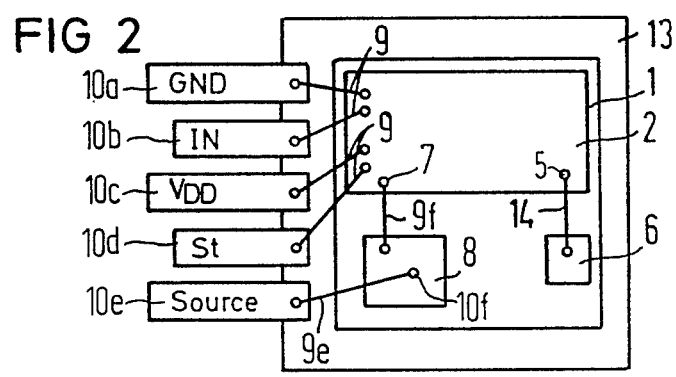
FIG. 2 is a top view of the semiconductor component.

In FIGS. 1 and 2, the power MOSFET is designated by the numeral 1. The integrated control circuit 2 is arranged on one of the main surfaces of the power MOSFET 1. As illustrated, the control circuit 2 has a smaller surface than the MOSFET 1. Additionally, the control circuit 2 is electrically insulated from the MOSFET 1 by an insulating layer 3, and mechanically coupled to the MOSFET 1 by means of a bonding layer 4. By way of example, the insulating layer can consist of silicon nitride $Si_3N_4$, and the bonding layer 4 of an insulating bonding material. The insulating layer 3 may be a component part of the semiconductor body 2 (control circuit) or the semiconductor body 1 (MOSFET). The semiconductor body of the MOSFET 1 has a first main side and a second main side. In the case where the insulating layer 3 is a component part of the semiconductor body 1, there is a bonding layer 4 between the insulating layer 3 and the semiconductor body 2. It is also possible to have the insulating layer 3 in the form of an insulating foil and to bond it to both semiconductor bodies 1, 2.

The semiconductor component formed by the semiconductor bodies 1 and 2 is fastened to a cooling body 13. A layer 12 between the semiconductor 1 and the cooling body 13 serves as the means of attachment. By way of example, the layer 12 may be a conductive bonding substance. In FIG. 1, the housing connections are generally designated by a 10, the leads are generally designated by a 9. The control circuit 2 is electrically coupled to the housing connections 10 by means of contacts and leads 9. The housing connections 10 are arranged on the side of the control circuit 2. The control circuit 2 controls the power FET transistor via a lead 14, that connects the output 5 of the control circuit 2 with the gate terminal 6 of the power FET. The source terminal of the power FET is linked to the source housing connection 10e and the control circuit 2 with a contact 8 and two leads 9e and 9f respectively.

The position of the contacts on the semiconductor bodies 1 and 2 is not limited to any specific location, they may equally well be arranged elsewhere on the surfaces of the semiconductor bodies 1, 2. The semiconductor component has a housing connection GND 10a for ground. This housing connection 10a is coupled with the semiconductor 2, since the control circuit 2 must be connected to the supply voltage. A second housing connection IN 10b is provided as control input. A signal at the control input IN 10b connects the power FET with the control circuit 2. A third housing connection $V_{DD}$ 10c serves to feed in the supply voltage for the control circuit 2 and is directly connected with the cooling body 13. The housing connection ST 10d serves to signal back such troubles as excess current, excessive temperature, overvoltage, loss of load, etc. The source voltage for the power FET is fed to the source housing connection 10e.

FIG. 2 illustrates a "high-side" switch, in which the load between the source terminal of the MOSFET and ground is connected and the drain connection is at $V_{DD}$.

Figure 3:
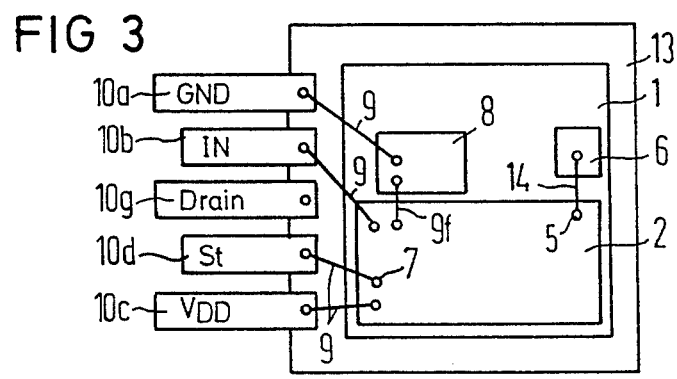
FIG. 3 is a top view of a second embodiment of a semiconductor component with a power MOSFET and control circuit embodying the present invention.

FIG. 3 illustrates a "low-side" switch, in which the load is connected between $V_{DD}$ and the drain terminal of the MOSFET and the source terminal is connected to ground. Unlike the arrangement of FIG. 2, this arrangement has no source terminal 10e but a drain terminal 10g that is connected to the cooling body 13.

Figure 4:
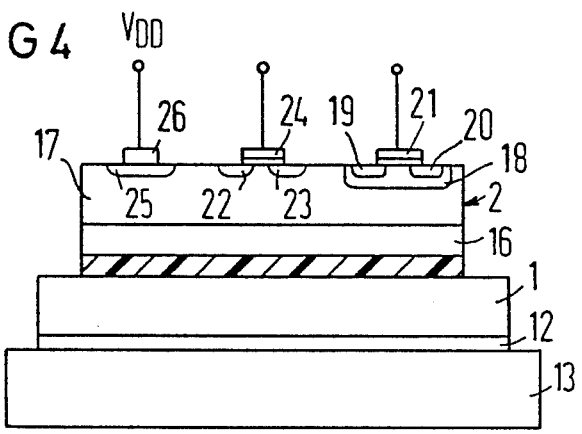
FIG. 4 is a lead arrangement for supplying voltage for the control circuit.

FIG. 4 is a section through a semiconductor component, in greatly simplified form. The semiconductor body 1 of the MOSFET and the other parts of the semiconductor component are not shown in section. The semiconductor component is manufactured utilizing self-insulating C-MOS technology, in a known manner.

Substituting for the generally quite complex structures, FIG. 4 merely shows schematically two integrated, mutually complementary side-by-side MOSFET's. The semiconductor body 2 is built on a highly n-doped substrate 16, and a weakly n-doped epitaxial layer 17 bordering on the substrate 16. A trough 18 with p-doping is embedded in the layer 17. Embedded in the trough 18 is a source zone with n-doping 19 and a drain zone with n-doping 20. This lateral n-channel FET is controlled with a gate electrode 21. A p-doped source zone 22 and a p-doped drain zone 23 are also embedded in the epitaxial layer 17. This lateral p-channel FET is controlled by a gate electrode 24. A zone 25 which is highly n-doped has been embedded in the main surface area that is turned away from the MOSFET. It is provided with a contact 26 and connected with the housing terminal $V_{DD}$. In this arrangement, the distance between the zone 25 and an integrated component of the control circuit is several times greater than the thickness of epitaxial layer 17. When supply voltage is applied to the terminal $V_{DD}$, the zone 17 also has a supply voltage, the pn junction between the zones 18 and 17 are biased in the reverse direction, the pn junctions between the zones 22, 23 and 17 are biased in the reverse direction, and the two MOSFET's of the control circuit are thereby electrically separated from each other. (For purposes of discussion, the control circuit has been reduced to the most important component parts and may be electrically connected to the cooling body 13.)

The control circuit may also be designed in the so-called junction-insulation technique in which elements embedded in an epitaxial layer 17 and having differing functions are separated from one another by a deep zone with strongly opposite doping that extends to another zone with opposite doping.

It is possible to separate the individual circuit components of the control circuit from one another by means of dielectric insulation, wherein with each functional unit is embedded in the substrate by means of a trough insulated by insulating material.

The control circuit can contain a circuit that is termperature-sensitive and gives a signal when a given temperature limit has been reached. In this case, the control circuit is connected with the power section in such a way that there is a good thermal contact between the semiconductor bodies 1 and 2. Generally, this has already been accomplished if the two semiconductor bodies are separated from each other by an insulating layer of only a few micrometers thickness.

Figure 5:
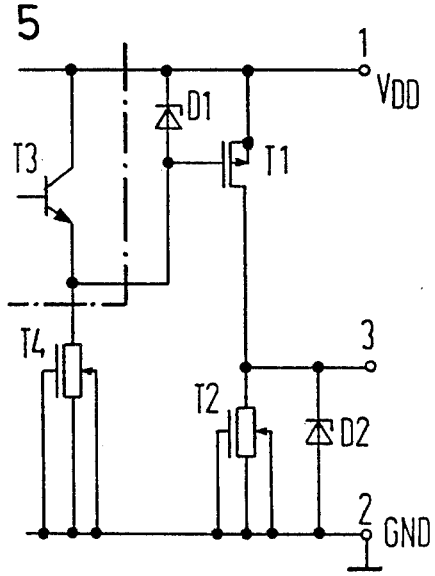
FIG. 5 is a portion of an embodiment of a integrated control circuit.

Such a circuit arrangement for the generation of a signal in the event of excessive temperature is shown in FIG. 5. It consists of a series connection between a p-channel FET T1 and an n-channel MOSFET T2. T1 is of the enhancement type and T2 of the depletion type. The FET T1, through its source connection, is coupled with a connector 1, to which the operating voltage $V_{DD}$ is connected. The source terminal of the MOSFET T2 is connected to ground GND via connector 2. The gate terminal of the MOSFET T2 is connected with its source terminal which functions as a source of current. The circuit arrangement also consists of a series connection between a bi-polar transistor T3 and a MOSFET T4 connected in parallel to the FET T1 and the MOSFET T2. The drain terminal of the MOSFET T4 is connected with the emitter terminal of the bi-polar transistor T3, whose collector terminal is coupled to the connector 1. The drain terminal of the MOSFET T4 and the emitter terminal of the bi-polar transistor T3, is electrically coupled with the gate terminal of the FET T1. A first zener diode D1 is located between the gate terminal of the FET T1 and the connector 1. The first zener diode D1 limits the gate-source biasing potential of the FET T1. A second zener diode D2 is located between the source and drain terminal of the FET T2. The second zener diode D2 limits the output voltage.

The bi-polar transistor T3 is the temperature sensor. All other components act as switches to generate an excess temperature signal. When the MOSFET T4 and the bi-polar transistor T3 heat up, the MOSFET's T4 current rises. When the current flowing through the bi-polar transistor T3 becomes greater than the current flowing through the MOSFET T4, the internal resistance of the MOSFET T4 increases sharply and the voltage at the gate terminal of the FET T1, starting from the ground potential, rises. If in the source of this event there is a drop below the starting potential of the FET T1, the latter will switch off and the potential at connector 3 drops back to ground potential. A logic circuit connected to the connectors 3 and 2 can then recognize this potential as an excess temperature signal and cause the switching off of the MOSFET T4, for example.

The control circuit may, of course, be designed for the performance of other functions. Respective possibilities are described in prior German patent applications such as P 36 09 235.5, P 36 09 236.3 and P 36 24 565.8. While two embodiments of the invention have been shown and described in detail herein, various other changes and modifications may be made without departing from the scope of the present invention.

We claim:

1. A semiconductor component comprising:
   a power MOSFET having a separate semiconductor body including a first main surface and a second main surface, and a gate terminal and a source terminal;
   an integrated control circuit for controlling the MOSFET, the integrated control circuit being integrated in a separate semiconductor body having a first main surface and a second main surface, the control circuit also having a control input, a supply voltage terminal, and a control output;
   a plurality of housing connections, a first one of the housing connections being connected to the control input, a second one of the housing connections being connected to the source terminal, a third one of the housing connections being connected to the supply voltage terminal, and the control output of the control circuit being connected to the gate terminal;
   an insulating layer for mechanically coupling the second main surface of the semiconductor body of the control circuit with the first main surface of the semiconductor body of the MOSFET, wherein the semiconductor body of the control circuit is mechanically coupled to the semiconductor body of the MOSFET; and
   a cooling body to which the second main surface of the semiconductor body of the MOSFET is fastened, and a fourth one of housing connections being connected to the cooling body.

2. The semiconductor component of claim 1, wherein the insulating layer is integral with the semiconductor body of the MOSFET.

3. The semiconductor component of claim 1, wherein the insulating layer is integral with the semiconductor body of the control circuit.

4. The semiconductor component of claim 1, wherein the semiconductor body of the MOSFET is bonded to the semiconductor body of the control circuit.

5. The semiconductor component of claim 2, wherein the semiconductor body of the MOSFET is bonded to the semiconductor body of the control circuit.

6. The semiconductor component of claim 3, wherein the semiconductor body of the MOSFET is bonded to the semiconductor body of the control circuit.

7. The semiconductor component of claim 4, further comprising a bonding material, wherein the bonding material produces an insulating bond.

8. The semiconductor component of claim 5, further comprising a bonding material, wherein the bonding material produces an insulating bond.

9. The semiconductor component of claim 6, further comprising a bonding material, wherein the bonding material produces an insulating bond.

10. The semiconductor component of claim 1, wherein the semiconductor body of the control circuit is in thermal contact with the semiconductor body of the MOSFET and the control circuit includes a temperature sensor electrically coupled to a switch for generating a signal when the temperature limit of the MOSFET is reached.

11. The semiconductor component of claim 2, wherein the semiconductor body of the control circuit is in thermal contact with the semiconductor body of the MOSFET and the control circuit includes a temperature sensor electrically coupled to a switch for generating a signal when the temperature limit of the MOSFET is reached.

12. The semiconductor component of claim 3, wherein the semiconductor body of the control circuit is in thermal contact with the semiconductor body of the MOSFET and the control circuit includes a temperature sensor electrically coupled to a switch for generating a signal when the temperature limit of the MOSFET is reached.

13. The semiconductor component of claim 4, wherein the semiconductor body of the control circuit is in thermal contact with the semiconductor body of the MOSFET and the control circuit includes a temperature sensor electrically coupled to a switch for generating a signal when the temperature limit of the MOSFET is reached.

14. The semiconductor component of claim 5, wherein the semiconductor body of the control circuit is in thermal contact with the semiconductor body of the MOSFET and the control circuit includes a temperature sensor electrically coupled to a switch for generating a signal when the temperature limit of the MOSFET is reached.

15. The semiconductor component of claim 6, wherein the semiconductor body of the control circuit is in thermal contact with the semiconductor body of the MOSFET and the control circuit includes a temperature sensor electrically coupled to a switch for generating a signal when the temperature limit of the MOSFET is reached.

16. The semiconductor component of claim 7, wherein the semiconductor body of the control circuit is in thermal contact with the semiconductor body of the MOSFET and the control circuit includes a temperature sensor electrically coupled to a switch for generating a signal when the temperature limit of the MOSFET is reached.

17. The semiconductor component of claim 8, wherein the semiconductor body of the control circuit is in thermal contact with the semiconductor body of the MOSFET and the control circuit includes a temperature sensor electrically coupled to a switch for generating a signal when the temperature limit of the MOSFET is reached.

18. The semiconductor component of claim 9, wherein the semiconductor body of the control circuit is in thermal contact with the semiconductor body of the MOSFET and the control circuit includes a temperature sensor electrically coupled to a switch for generating a signal when the temperature limit of the MOSFET is reached.

19. The semiconductor component of one of claims 1-9 and 11-18, further comprising:
a highly-doped substrate, wherein the control circuit is built on the highly-doped substrate and the MOSFET is electrically connected with the highly-doped substrate; and
a contact provided on the side of the semiconductor body of the control circuit opposite the MOSFET.

20. The semiconductor component of claim 19, further comprising a highly-doped zone, of the same type as the substrate, on the control circuit, wherein the contact is on the highly-doped zone.

21. The semiconductor component of claim 1, wherein said second main surface of the semiconductor body of the control circuit has a smaller surface area than that of the first main surface of the semiconductor body of the MOSFET to which it is mechanically coupled, and wherein said source and gate terminals of the MOSFET are positioned on areas of the first main surface of the semiconductor body of the MOSFET not taken up by the semiconductor body of the control circuit.

* * * * *